(12) United States Patent
Chen et al.

(10) Patent No.: US 8,718,983 B1
(45) Date of Patent: May 6, 2014

(54) INTUITIVE INTERACTIVE CLONING FOR CUSTOM LAYOUT GENERATION

(75) Inventors: Haichun Chen, Sunnyvale, CA (US); Ming Su, Nepean (CA)

(73) Assignee: Synopsys Inc., Mountain View, CA (US)

( * ) Notice: Subject to any disclaimer, the term of this patent is extended or adjusted under 35 U.S.C. 154(b) by 310 days.

(21) Appl. No.: 13/223,243

(22) Filed: Aug. 31, 2011

(51) Int. Cl.
*G06F 17/50* (2006.01)

(52) U.S. Cl.
USPC .............................................................. 703/1

(58) Field of Classification Search
USPC .............................................................. 703/1
See application file for complete search history.

(56) References Cited

U.S. PATENT DOCUMENTS

| | | | |
|---|---|---|---|
| 6,480,995 B1* | 11/2002 | Schmidt et al. | 716/112 |
| 7,293,247 B1* | 11/2007 | Newton et al. | 716/111 |
| 7,418,683 B1* | 8/2008 | Sonnard et al. | 716/122 |
| 7,546,556 B1* | 6/2009 | Wagner | 716/110 |
| 7,949,987 B1* | 5/2011 | Ginetti et al. | 716/139 |
| 2004/0034842 A1* | 2/2004 | Mantey et al. | 716/15 |
| 2009/0327988 A1* | 12/2009 | Ladin et al. | 716/11 |
| 2011/0307854 A1* | 12/2011 | Lu et al. | 716/119 |

OTHER PUBLICATIONS

Makiko Itoh et al., "ALE: a layout generating and editing system for analog LSIs," 1990, IEEE International Symposium on Circuits and Systems, pp. 843-846.*
Cadence Virtuoso Layout Suite XL, 2011, Cadence Design Systems, Inc., pp. 1-5.
Cadence Virtuoso Layout Suite XL User Guide, Product Version 6.1, Jan. 2007.
Cadence White Paper, Automatic Placement for Custom Layout in Virtuoso Layout Suite GXL, 2009, Cadence Design Systems, Inc., pp. 1-9.
SpringSoft, Laker Custom Layout Automation System, 2010, SpringSoft, Inc., 6 pages.

* cited by examiner

*Primary Examiner* — Kamini S Shah
*Assistant Examiner* — Russ Guill
(74) *Attorney, Agent, or Firm* — Baker Botts L.L.P.

(57) ABSTRACT

A computer system and corresponding process is disclosed for making a design layout based on a schematic diagram. The system comprises a user interface which includes a display of a schematic diagram of a layout to be designed. The schematic diagram includes multiple occurrences of a target element. Source elements are displayed, which correspond with the target element. One occurrence of multiple occurrences of the target element shown in the schematic diagram is selected. The source element is applied to the selected target element. A computer program product bears software for directing a computer system to perform the foregoing.

15 Claims, 10 Drawing Sheets

INTUITIVE INTERACTIVE CLONING FOR CUSTOM LAYOUT GENERATION

FIELD OF THE ART

The disclosure generally relates to the field of design layout, such as the layout of electronic circuits, for designs including modular sub-structures. The disclosure pertains to computer-based systems and methods for doing such design layout, and user interfaces for such computer-based systems and methods.

BACKGROUND

Cloning is a technique used by custom layout designers (for instance, designers of analog solid-state semiconductor circuitry) to re-use existing layout, which is referred to herein as "source layout" or "source". Such existing layout may include, for example, circuit elements such as field-effect transistors (FETs), which are defined in terms of geometries for the drain, gate and source, with connection points, etc. The geometries are used for semiconductor fabrication of the circuit elements.

Typically, a circuit design is expressed in the form of a schematic diagram, showing the elements (also called sub-structures) of the circuit, and their interconnections. For instance, a circuit schematic-level design might include multiple occurrences of a given type of FET. The elements or substructures are herein referred to as "targets". In such a design including multiple occurrences of a circuit element such as the circuit elements (for instance, FETs) described above, each occurrence of the circuit element is placed, routed and optimized at a respective location within the schematic design.

Doing a design layout involves generating a design layout made up of semiconductor layouts of the circuit elements, with a connective topography the same as that given in the schematic diagram. Where the schematic diagram calls for multiple occurrences of a given circuit element, cloning involves using a semiconductor layout of the circuit element multiple times in the design layout.

Cloning typically involves three steps: (1) Define or extract a connectivity pattern of the source layout. (2) Identify sub structures (referred to herein as "targets", "target elements" or "target components") in the design whose functionality and connectivity pattern match that of the source layout. (3) For each identified sub structure, make a geometrical copy of the source layout, and update the copy's connectivity against the target, to be the same as the target.

In the past, such placement, routing and optimization has been done manually by the designer. More recently, designers have been able to employ a computer-based design layout system. Examples of such layout design systems include the Virtuoso Layout Suite XL product of Cadence Design Systems, Inc., and the Laker Layout Editor of SpringSoft, Inc.

SUMMARY

An example embodiment includes a computer system for making a design layout based on a schematic diagram, comprises a user interface which includes a display of a schematic diagram of a layout to be designed, the schematic diagram including multiple occurrences of a target element; a display of source elements which correspond with the target element; means for selecting one of the multiple occurrences of the target element in the schematic diagram; and means for applying the source element to the selected target element.

Further features and advantages of disclosed embodiments, as well as the structure and operation, are described in detail below with reference to the accompanying exemplary drawings.

DETAILED DESCRIPTION

Figure 1:
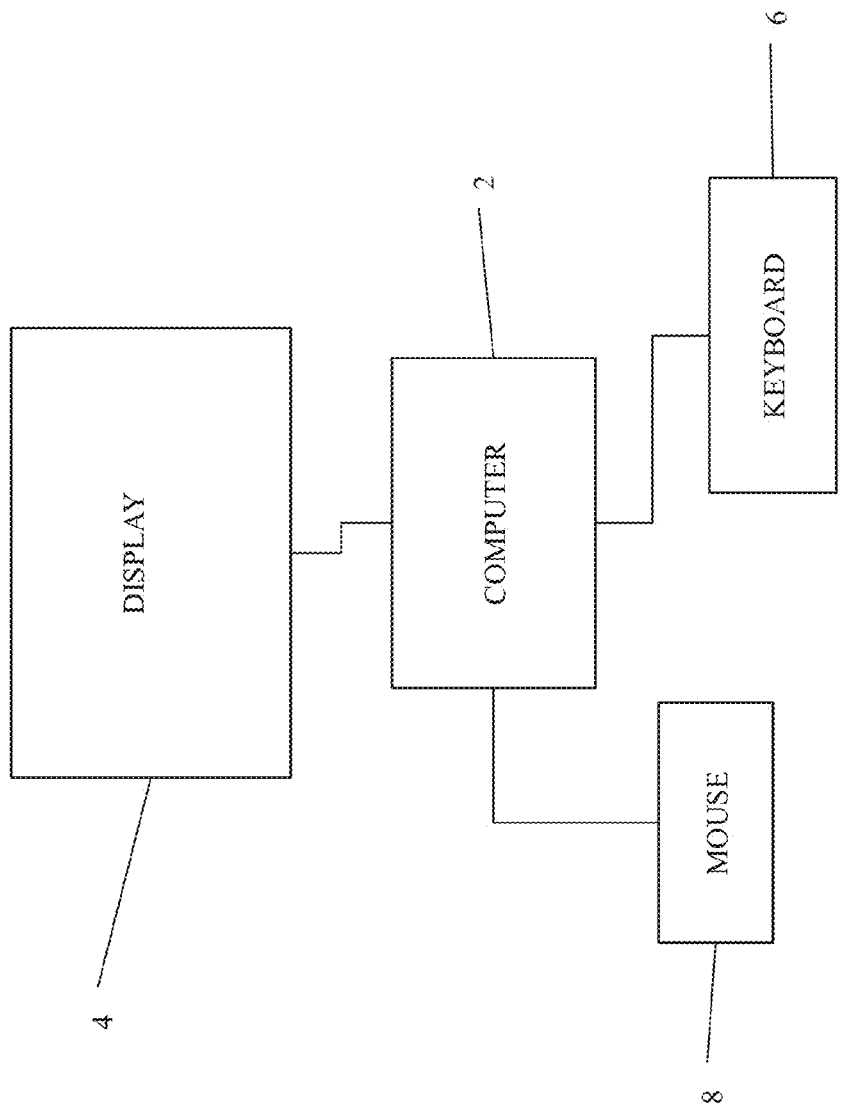
FIG. 1 is a system block diagram of a computer system according to an embodiment.
Figure 10:
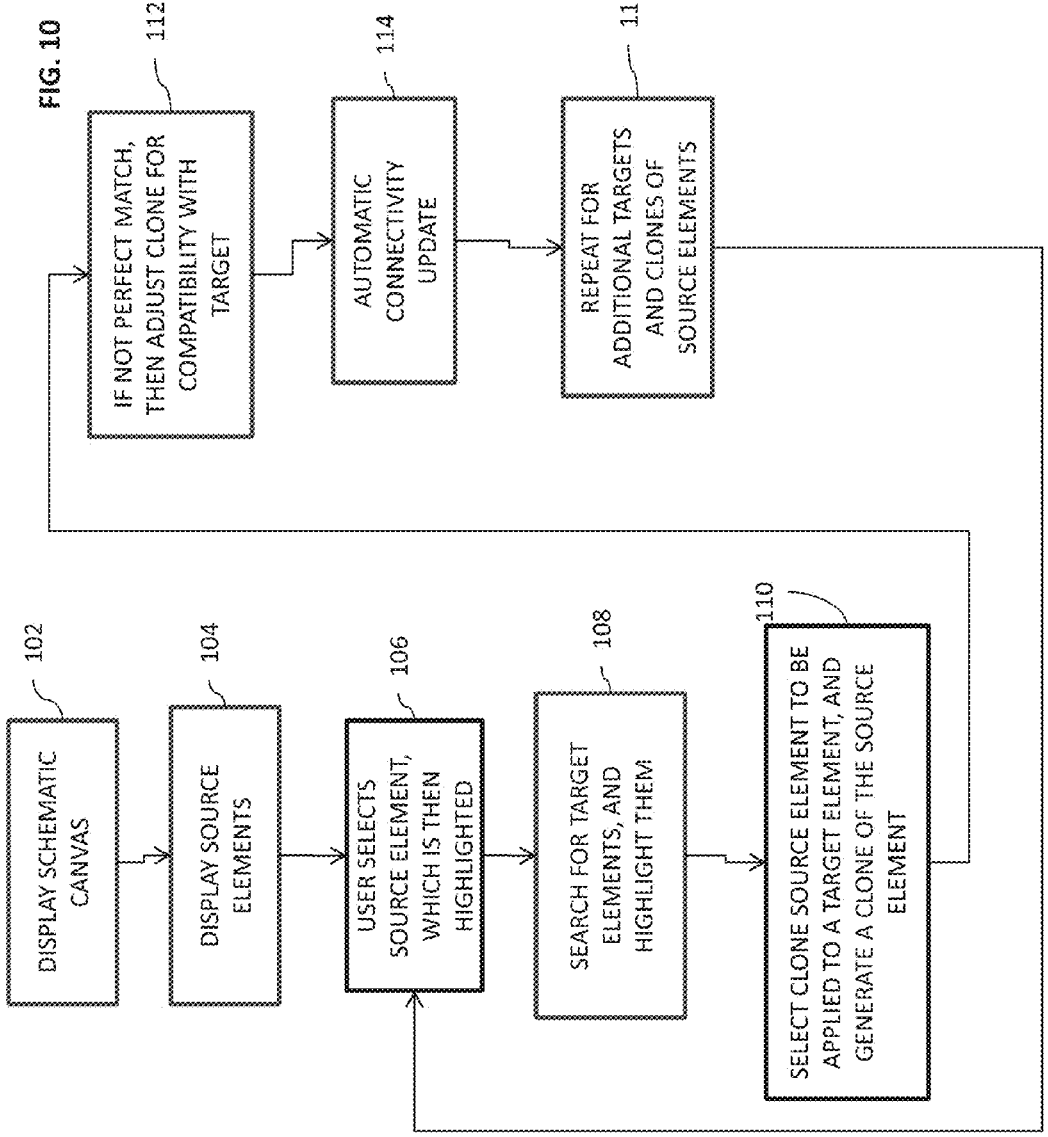
FIG. 10 is a flowchart showing operation of an embodiment.

FIG. 1 is a system block diagram showing an example computer system for use with the configurations disclosed. The computer system includes a computer unit 2, a display 4 and user input apparatus, in this case a keyboard 6 and a mouse 8. The invention may be embodied as a system as shown. Alternatively, the invention may be embodied in a computer program product such as a pre-recorded CD-ROM bearing program code for directing the computer system to perform an embodiment, as shown for instance in FIG. 10. The computer program product is not shown separately, but it will be understood by persons skilled in the art that a CD-ROM, etc., is installed in the computer system in known fashion, for installation and execution of the software. Also, the disclosed configurations may be embodied in the method itself, also as shown in FIG. 10.

Embodiments of the invention provide a user interface for design layout that is simple and intuitive, as will be seen in the detailed discussion that follows.

Figure 2:
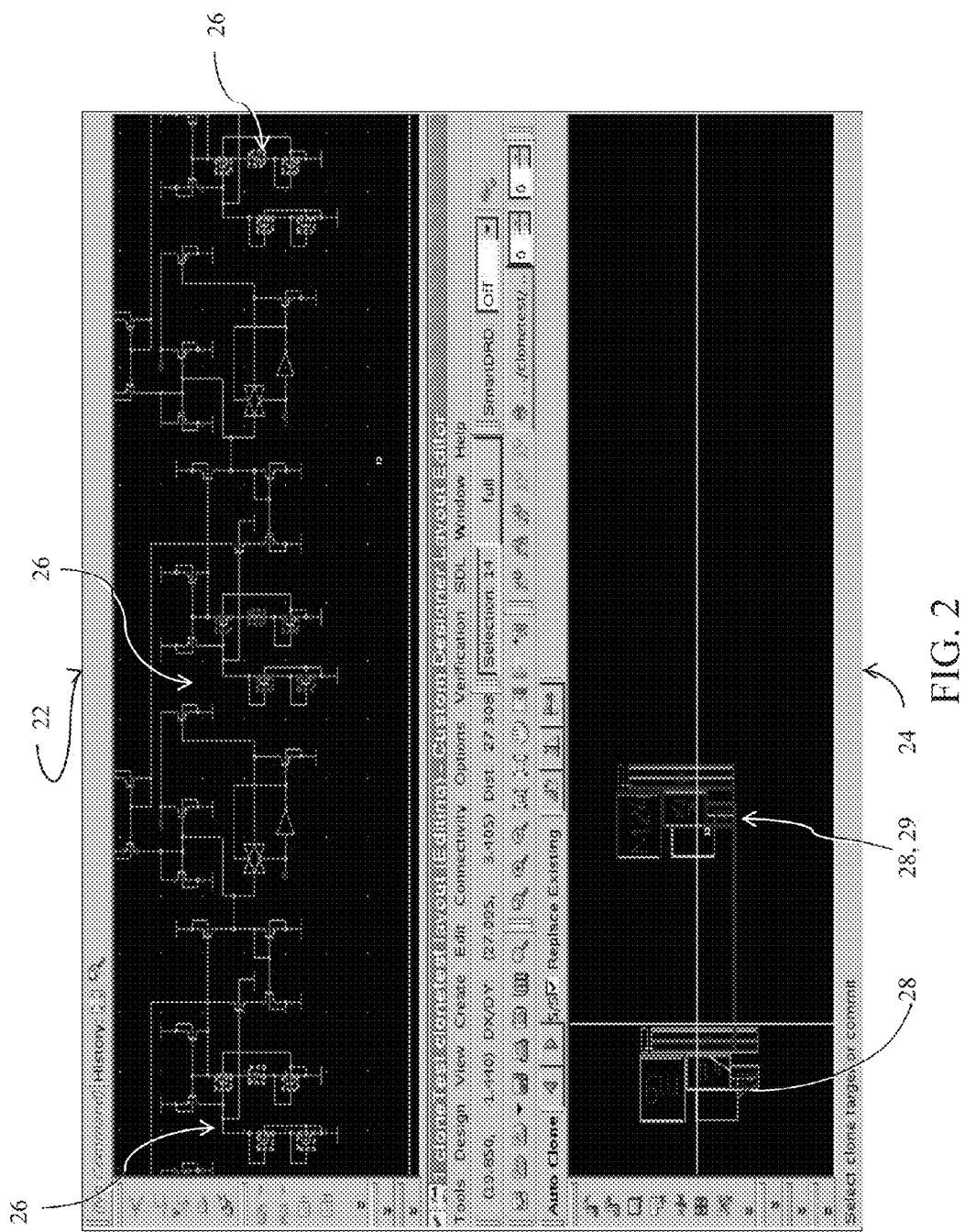
FIG. 2 is a computer display window showing a schematic diagram of a design layout and a target layout, in accordance with an embodiment.

FIG. 2 is an illustration of a graphical user interface display image of an embodiment. The graphical user interface display image may be thought of, metaphorically, as a "design canvas," and will be referred to thusly in the discussion that follows.

The display image comprises two parts. First, there is shown a schematic illustration 22 of a design layout to be implemented. This is displayed as per 102 in FIG. 10. In this case, the schematic illustration is that of an electronic circuit. The task at hand is to implement the illustrated electronic circuit as a semiconductor design layout. Circuit elements shown schematically are to be implemented as semiconductor design layout elements, in preparation for fabrication. The schematic illustration 22 may also be referred to as a "schematic canvas". As noted before, circuit elements, etc., within the schematic canvas 22 are referred to herein as "targets" or target elements". In particular, certain groups of targets in the schematic canvas 22, the targets generally shown as 26, will be discussed in detail. Also, the respective locations of the target elements, within the schematic illustration, may be referred to as "target positions".

In the illustrated embodiment, a second portion 24 of the display image provides source elements, displayed as per 104 in FIG. 10, which the user may examine, select, and input to the design layout in accordance with the schematic illustration.

Display of Source Elements

In an embodiment, there are provided various types of circuit components, such as FETs, bipolar transistors, passive components such as resistors, capacitors, etc., amplifiers, and other types of circuit elements that would be known to those skilled in the art of circuit design. Embodiments also can address the digital domain, by providing digital elements such as logic gates, latches flip-flops, memory cells, etc. The foregoing will be referred to as "source elements" or "source components". The source elements are also characterized by the geometry of their implementation. For instance, two different FET source elements might have different shapes or form factors, and might have contact points positioned differently, such as all on the same side, versus different contacts on different sides. Depending on the topology of the contacts to different components in the design canvas, one of the FET source elements might be a better topological match than the other.

Alternatively, they may be obtained by copying from a pre-existing source, such as an earlier-generation semiconductor design layout. Alternatively, then may be obtained by copying from a pre-existing source, such as an earlier-generation semiconductor design layout. Also, a library of semiconductor device layouts may be provided, along with cataloging by device type, etc., and browsing and searching capability to allow the user to find desired design layout elements easily and intuitively.

In an embodiment, a source element obtained as described above, and displayed in the second portion 24 of the design canvas, may be treated and referred to as a "clone source" or "clone source element" 28. In operation of such an embodiment, the user obtains the clone source element, and uses it to generate one or more clones, which are mapped individually to target elements within the schematic canvas. This will be described in more detail below.

The source elements 28 may be displayed in the second portion 24 or otherwise shown in various forms, such as a list of descriptions in text form, graphical descriptions which symbolize in schematic form the functionality of the source components, geometric illustrations of the size and shape of the source elements, etc. In the present embodiment, the source elements 28 are shown as geometric illustrations with component legends. It is often the case that a circuit schematic diagram will have individual legends for components, such R1, R2, R3, etc. for resistors. In an embodiment, such legends may be automatically generated for the components of the design layout, and the source elements 28 displayed may reflect such legends, to help the user intuitively see which source elements are to be matched with which target elements in the schematic illustration 22.

Selection of Target Elements

Referring to the lower portion 24, the user employs a user input interface device to select one or more circuit elements shown as source elements (shown as 106 in FIG. 10). In an embodiment, for instance, the user employs a selection mechanism, e.g., a mouse, a touchpad, a trackball, etc., to select the portion by clicking, dragging, and releasing over a region of the design canvas. The source elements within the selected portion are thus selected for use as a clone source. In an embodiment, the selected source elements are highlighted, such as by bolding or color changing (also shown as 106 in FIG. 10).

Often, the selected portion of the design canvas might include different types of components. For instance, the selected portion might include two FETs that the user is interested in, as well as a nearby resistor. In an embodiment, all of these source components would be highlighted. However, in a separate user activity such as a mouse click on one of the FETs, that FET, and any other FETs also within the selected portion of the design canvas, would be highlighted differently to indicate that the user is working on these source elements in particular.

Additionally, an individual one of a plurality of such selected target components may be selected, by clicking on it, stepping through selected target components one by one, etc. For instance, if two FETs are selected as target components as described above, keystrokes on keys such as the left and right arrows of the keyboard, may be used to select one or the other of the two FETs. Such an individually selected target element may be highlighted in a distinctively different manner from the rest of the highlighted target elements with the selected region of the schematic canvas.

Automatic Search for Target Elements

In an embodiment, an automatic search is made, based on the selected source elements 28 as described above, to search for target elements 26 in the schematic diagram 22, whose functionality and whose topology or connectivity make them eligible for use as candidates for cloning the selected source elements 28. This is shown as 108 in FIG. 10. Such an automatic target element search takes place responsive to the user's selection of a region of the layout canvas 24 containing source elements 28, or responsive to the user's selection of an individual one of multiple selected source elements 28.

For instance, if an FET is selected for use as a clone source (such as 28) in the second portion 24 of the display canvas, then the FETs are automatically identified and displayed at respective target positions (the positions of the targets 26) in the schematic illustration 22 of the display canvas. The user may select from among the displayed target elements 26 by clicking on one of them, stepping through them one by one, etc.

Thus the user may select a target element 26, or a plurality of similar target elements 26 from within the schematic illustration 22, and may select a source element 28 to be used as a clone source in the second portion 24 of the display image. Then, by a simple user input such as a mouse click or keystroke, the user may implement the selected target element or elements within the design canvas, by cloning the selected clone source element and inserting the clones into the design layout. This selection and cloning is shown as 110 in FIG. 10. For instance, in FIG. 2, we might say that the left-most source element 28 is a clone source. When the user clones the clone source element, the right-most source element 28 is generated. Since this right-most source element is a clone, it is separately designated as a clone 29.

The graphical user interface, such as that illustrated in the second portion 24 of the display image of FIG. 2, facilitates the user's selection of a displayed clone source element. In an embodiment, the user may do so by manipulating a selection mechanism to send a signal to the computer system, for instance by performing standard, simple user interface activities such as mouse clicking, holding and dragging; or by employing special keyboard keys such as control-click, shift-click, etc.

Responsive to any layout selection change in the layout 24, for instance by selecting a different set of source elements, a new clone target search is automatically done. As a result, different circuit elements in the schematic diagram 22 will be identified and highlighted, to indicate that they are candidates for having the newly selected source element applied to them. This allows the user's attention to remain on the schematic diagram 22, without requiring further user action, or requiring the user's attention to shift away from the schematic diagram 22 to the design layout system's other functions.

Imperfect Match

It will sometimes be the case that a source element is a functional match with a selected target element, but is not a perfect match with the target element. Such a target may have design requirements in terms of factors such as geometry, scaling, contact point placement, etc. Such factors are herein referred to a "predetermined characteristic". Also, the variability or differences from such a perfect match with the target's design requirements are referred to as "different device parameterization", or merely as "variability of the predetermined characteristic". In an embodiment, it is possible to allow for such different device parameterization between the selected source element or elements in the design canvas, and the target or targets to be offered for user selection. If the user selects such an imperfectly matching target for the selected source, then the clone of the selected source element is automatically modified to match the requirements of the target. This is shown as 112 in FIG. 10. That is to say, the clone of the source element is varied correspondingly with the variability of the predetermined characteristic of the target. Such modification can include one- or two-dimensional scaling of geometric dimensions to re-size the clone, topological repositioning of contact points on the clone to conform with those of the target, etc.

Target and source selection may be implemented so as to encompass all possible such modifications which can make a non-matching but functionally equivalent target element usable for the source element. Also, the user may limit the number of target elements automatically identified, for instance by entering limitations on variability of dimensions, choosing scaling but not contact point repositioning, etc. Such limitations would then reduce the number and scope of target elements for which clones of the selected source element will be utilized. For instance, in an embodiment the user may call up a menu of the above-discussed "predetermined characteristics" that apply to a given source element, such as responsive to a right-click of a mouse positioned on the source element. For each such menu item, the user may check or un-check the predetermined characteristic, to instruct the system whether or not to use the predetermined characteristic as a limitation on the target elements to be found. (Such entered limitations may be thought of as the equivalent of performing a database search using a Boolean search string, by adding additional search terms, or eliminating search terms, to reduce the number of postings or "hits" the Boolean search string finds.) Conversely, the user may also expand the number of target element identified, for instance by ignoring bulk connections or ignoring specific devices within a target substructure made up of a plurality of devices, etc.

Automatic Connectivity Update

As described above, the user selects source elements within the design canvas, and applies target elements which had been automatically taken from the target library and displayed, to the respective source elements. Additionally, the connections between such applied target elements must match those corresponding connections in the schematic. In an embodiment of the invention, the connectivity is automatically applied, and updated, as the user selects targets to apply to the clones of the selected source elements.

During the target search, source-to-target object mappings are done automatically and in real time as the user searches and selects the targets. In an embodiment, connectivity is updated automatically using the mappings. Thus, a layout copy of the design to be laid out matches connectivity of the chosen targets. This is automatically done, no user action is needed for the laid out copy to match the connectivity of the chosen targets. This is shown as 114 in FIG. 10.

Figure 3:
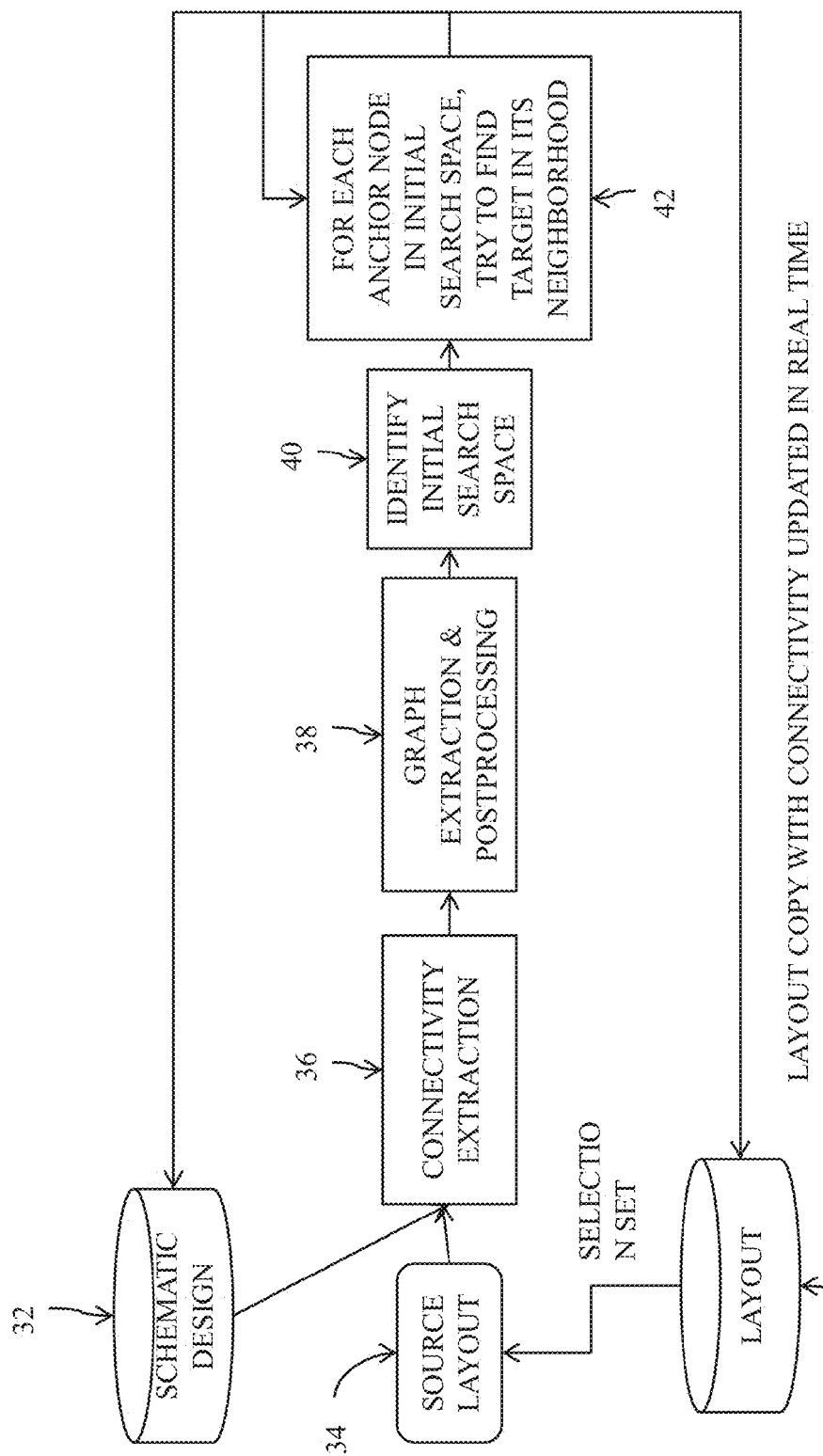
FIG. 3 is a system block diagram and flowchart showing a method for generating a design layout employing target elements, based on a source schematic design, in accordance with an embodiment.

FIG. 3 is a system block diagram and flowchart illustrating operation of an example embodiment. A schematic design 32 is provided, such as would be displayed as the schematic illustration 22 of FIG. 2. A source layout 34 is processed iteratively. Connectivity extraction 36 is performed on target elements of the schematic design 32, as well as on source elements of the source layout 34. Graph extraction and post-processing 38 is performed, to provide the graphical representation of the schematic design 32 that is displayed in the schematic illustration 22 of FIG. 2, as well as of the source layout that is displayed in the layout illustration in the lower portion 24 of FIG. 2. As described above, and shown here as 40, the user employs user input devices such as the mouse, to select a portion (a "search space") of the layout illustration 24. The source elements within that selected portion (i.e., the source layout 34 of FIG. 3) form a pattern for the target search, shown here as 42. Such identified and displayed targets, when selected by the user as described above, are added to the design layout 44. This process runs repeatedly, such as iteratively, until the user has selected targets for all desired elements of the schematic design 32. This repetition is shown as 116 in FIG. 10.

An Example of Operation of an Embodiment: FIGS. 4-9

FIGS. 4, 5, 6, 7, 8, and 9 are a set of screen shots showing the operation of an example embodiment, from the standpoint of the user interface. The upper and lower portions 22 and 24 of the display will be referred to by number, as above.

Figure 4:
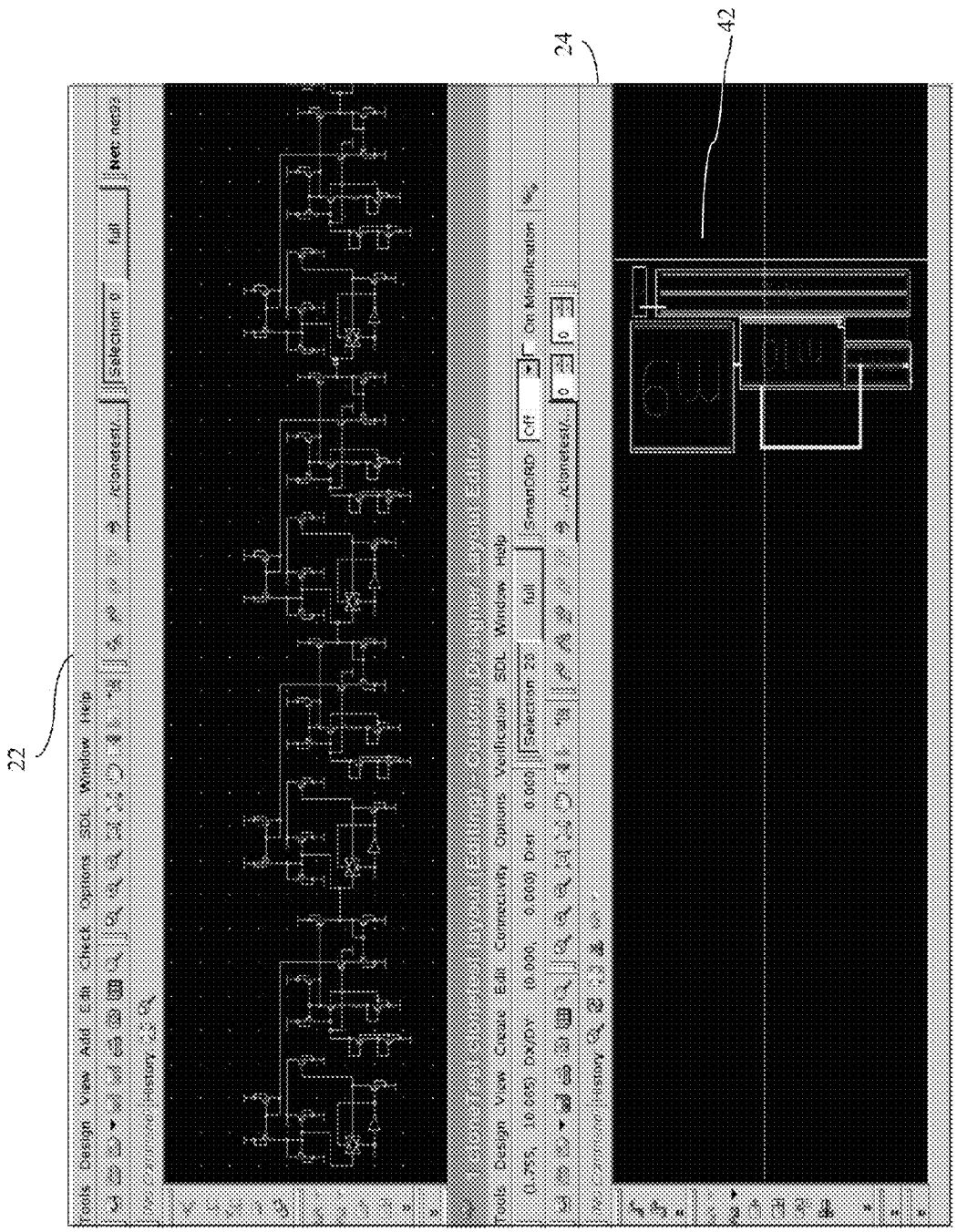
FIGS. 4, 5, 6, 7, 8, and 9 together make up a sequence of user interface screen shots which illustrate the operation of an embodiment.

FIG. 4: Before Invoke Clone Command

FIG. 4 illustrates an example of a user interface as it would appear prior to the selection of a clone source for cloning. In the upper portion, i.e., the schematic diagram 22, a circuit is shown, including various circuit elements and electrical connections therebetween. In an embodiment, various schemes such as color-coding, bolding, geometric shapes, etc., may be used to help the user perceive the circuit intuitively, for instance green circuit elements, blue interconnections, and red contact points. However, at this point no particular portion of the schematic diagram is the particular subject of the user's attention, and no distinctive highlighting, etc., is used to distinguish any portion of the schematic diagram from the rest of it.

In the lower portion 24, a source element 42 is shown. This particular source element 42 has been represented in terms of the geometries of the semiconductor layout of the element, i.e., in terms of various superimposed rectangles and other geometric shapes. This for instance might represent how the semiconductor device is fabricated. Also, in this embodiment, legends m9 and m10 represent legends for individual components such as FETs.

Figure 5:
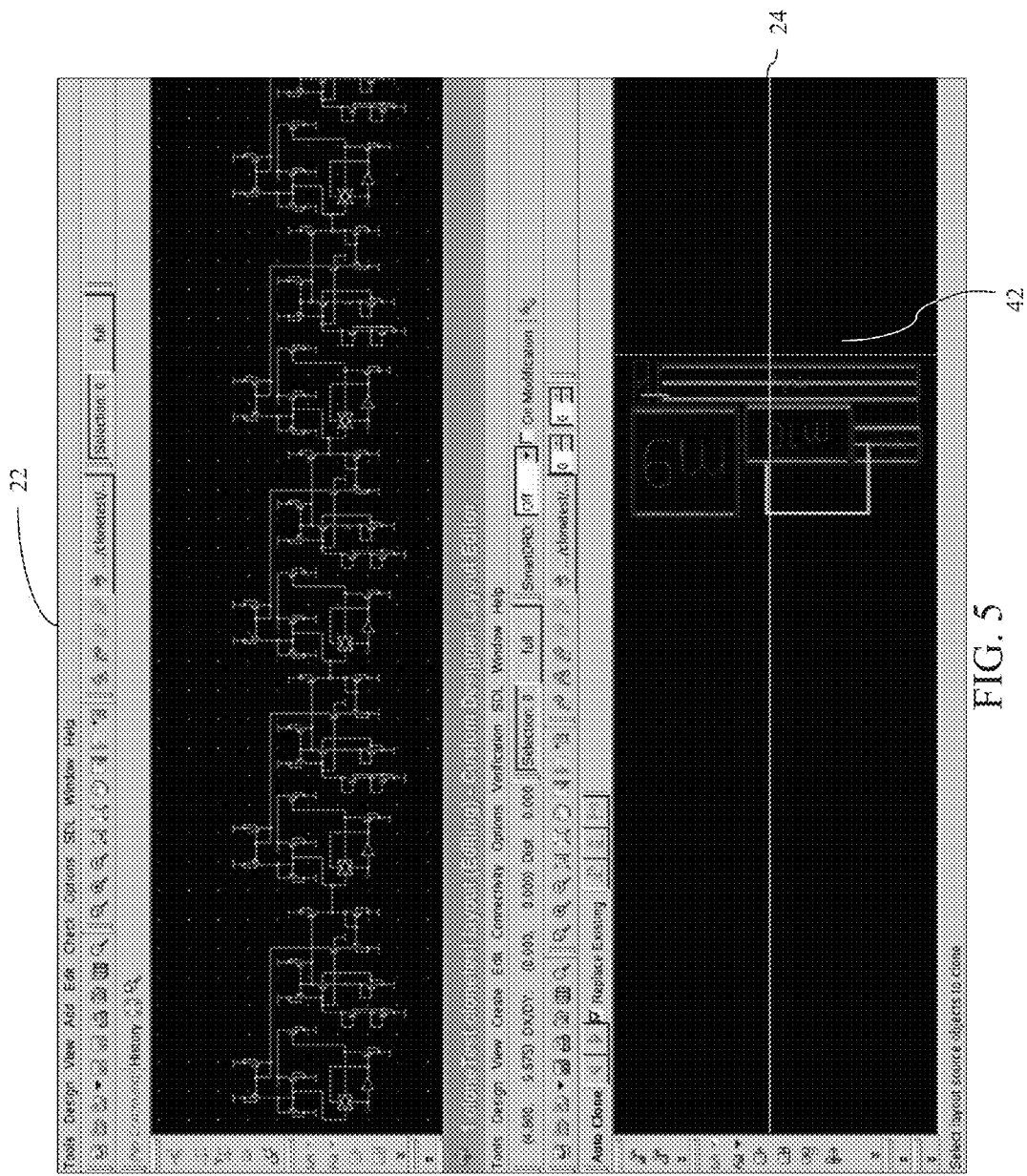

FIG. 5: after Clone Command is Invoked without User Selection

FIG. 5 illustrates an example of the user interface as it would appear after the user enters a command to invoke a clone commend. In this scenario, the user observed the source element 42 in the lower portion 24 of FIG. 4, and decided to select a source element to be used as a clone source, to clone source elements for use in implementing the schematic diagram of FIG. 4.

Invoking the clone command causes new user interface information to appear. Referring to the lower portion 24 of the design canvas, the third row of user command switches (which will also be referred to as the clone command toolbar)

beneath the pull-down menus now shows an Auto Clone control, with left- and right-arrows to allow the user to select between target elements.

In the first row of user command switches, ordered pairs of coordinates represent X- and Y-coordinate positions within the design canvas. The legend "Selection: 0" indicates no clone source has, as yet, been selected.

Figure 6:
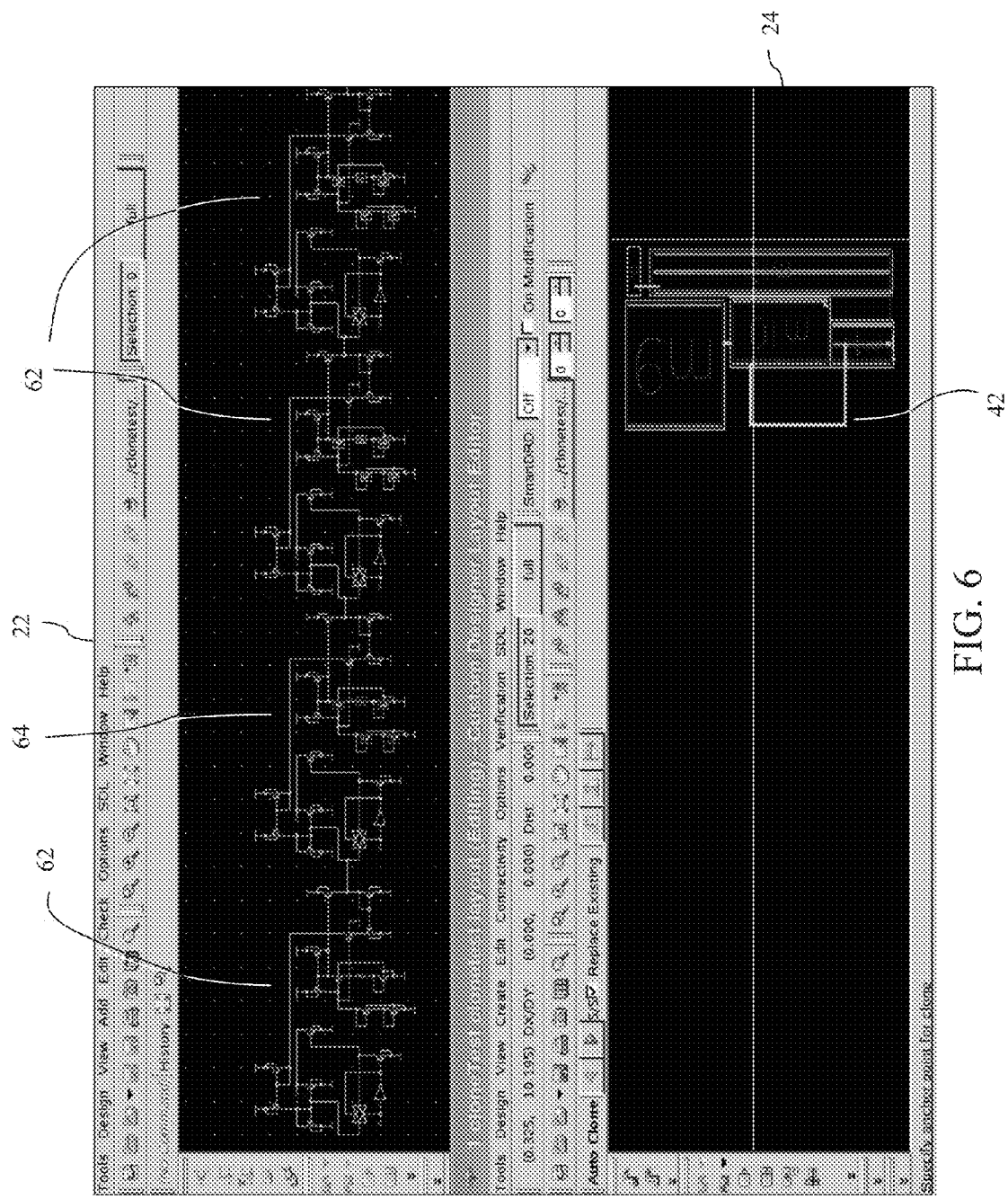

FIG. 6: after User Selects the Clone Source, the Targets are Immediately Identified and Highlighted in the Schematic Window FIG. 6 illustrates an example of the user interface as it would appear after the user selects a clone source. Referring back to FIG. 5, this will have been done by a user command, such as a mouse click on the source element 42 shown in the lower portion 24, indicating that the user intends to use the source element 42 as a clone source.

In the upper portion 22, several groups of circuit elements 62 and 64 have been identified as target candidates. (It so happens that, in this exemplary schematic design, the elements are in groups of five that are close to each other.) In particular, one of the groups separately designated as 64 in FIG. 6, are highlighted distinctively from the other groups 62, for instance to indicate that these target candidates are the particular subject of the user's attention. In this embodiment, the five groups of identified circuit elements are set off distinctly, for instance by changing their color. Note that the five target candidates within each group are functionally the same as that of the clone source of the lower portion 24. It may, however, select elements that are not an exact match, but rather vary as to a predetermined characteristic. For instance, if a selected source FET and a selected target FET have different sizes, they might nonetheless be selected, as per the discussion of imperfect matches, above.

The user interface reflects the user selection of the clone source 42. For instance, in the first row of user command switches of the lower portion 24, the legend that had read "Selection: 0" now reads "Selection: 20" to indicate that a selection has been made. Also, in the third row of user command switches, the legend "⅗" has appeared, to indicate the number of target elements that are subject to layout using clones of the selected clone source 42 shown in the lower portion 24.

Figure 7:
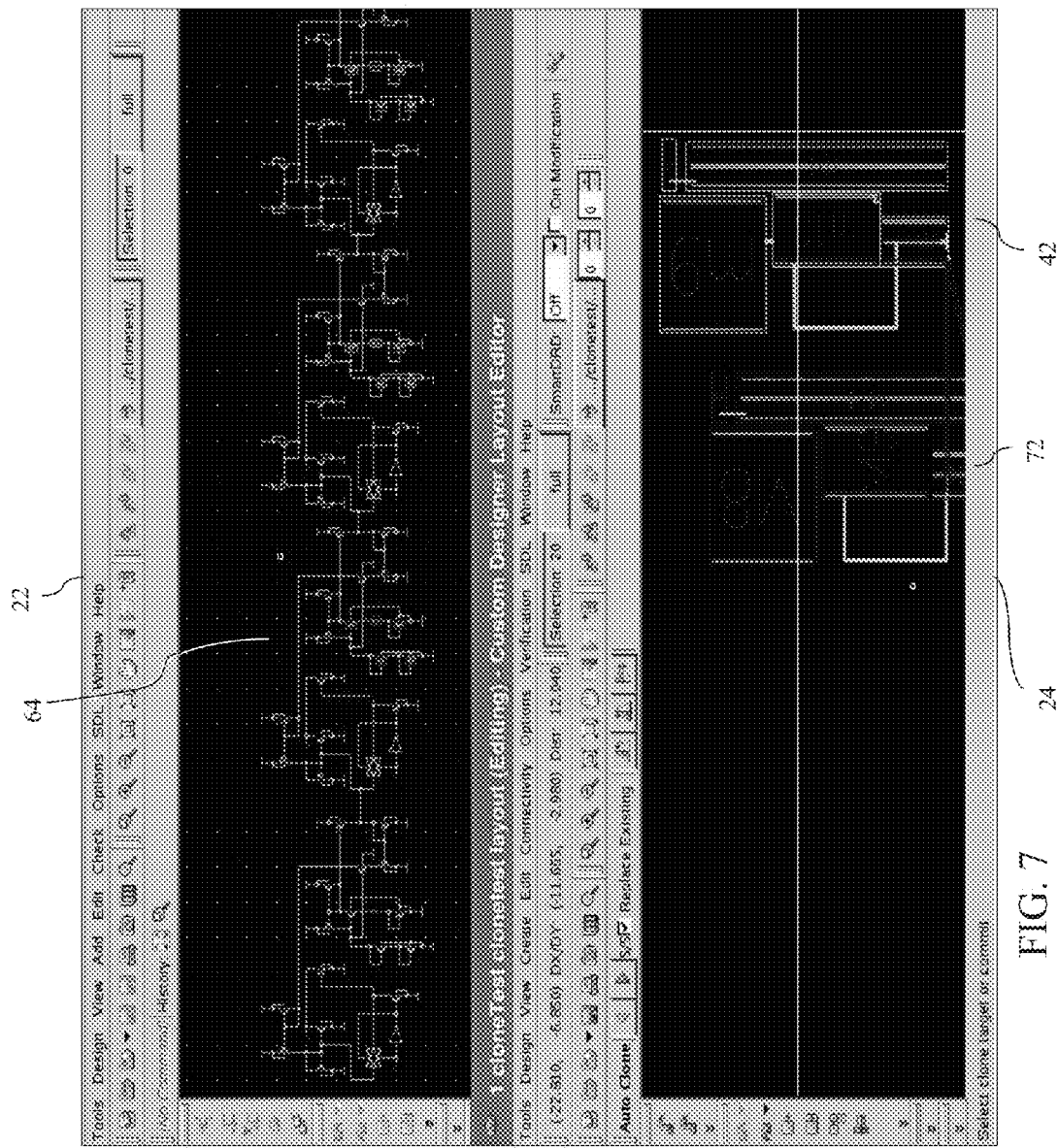

FIG. 7: as Soon as User Specifies Anchor Point, the First Clone Target is Realized in Layout, Device Names and Interconnect Names are all Automatically Updated Per Schematic Clone Target FIG. 7 illustrates an example of the user interface as it would appear, following that of FIG. 6, where the user has generated a clone 72 from the clone source 42 of the lower portion 24. The user does so, for instance by entering a command such as a mouse click on the clone source 42. As a result, a clone 72 appears in the lower portion 24. As shown in FIG. 7, the clone source 42, having the legends m9 and m10, is still visible. The clone 72 may use different color-coding, bolding, etc., to visually distinguish it from the clone source 42. However, it is geometrically similar to the clone source 42, so the user can easily perceive that the clone 72 is indeed a clone of the clone source 42. Also, in this embodiment the newly generated clone 72 shows legends M8, M9, and M11, which distinguish it uniquely, and which may also designate which particular one of the selected target elements (for instance within the group 64) of the upper portion 22 it is to implement. Legends may be used to distinguish a clone from the clone source from which it was generated. For instance, in this embodiment, the clone source 42 shows legends with lower case letters (e.g., m9, m10), while the clone 72 shows upper-case letters (e.g., M8, M9, etc.).

In the third row of user command switches, the legend "Replace Existing", which until now has been grayed out indicating non-functionality, now shows three switches bearing triangular legends. The user may choose between various selected target elements by clicking appropriately on these switches, or by using key strokes that are bound to these switches.

Note, however, that at this point the user has not actually committed the generated clone 72 to the layout design in the lower portion 24. This will be addressed in connection with FIG. 9, below.

Figure 8:
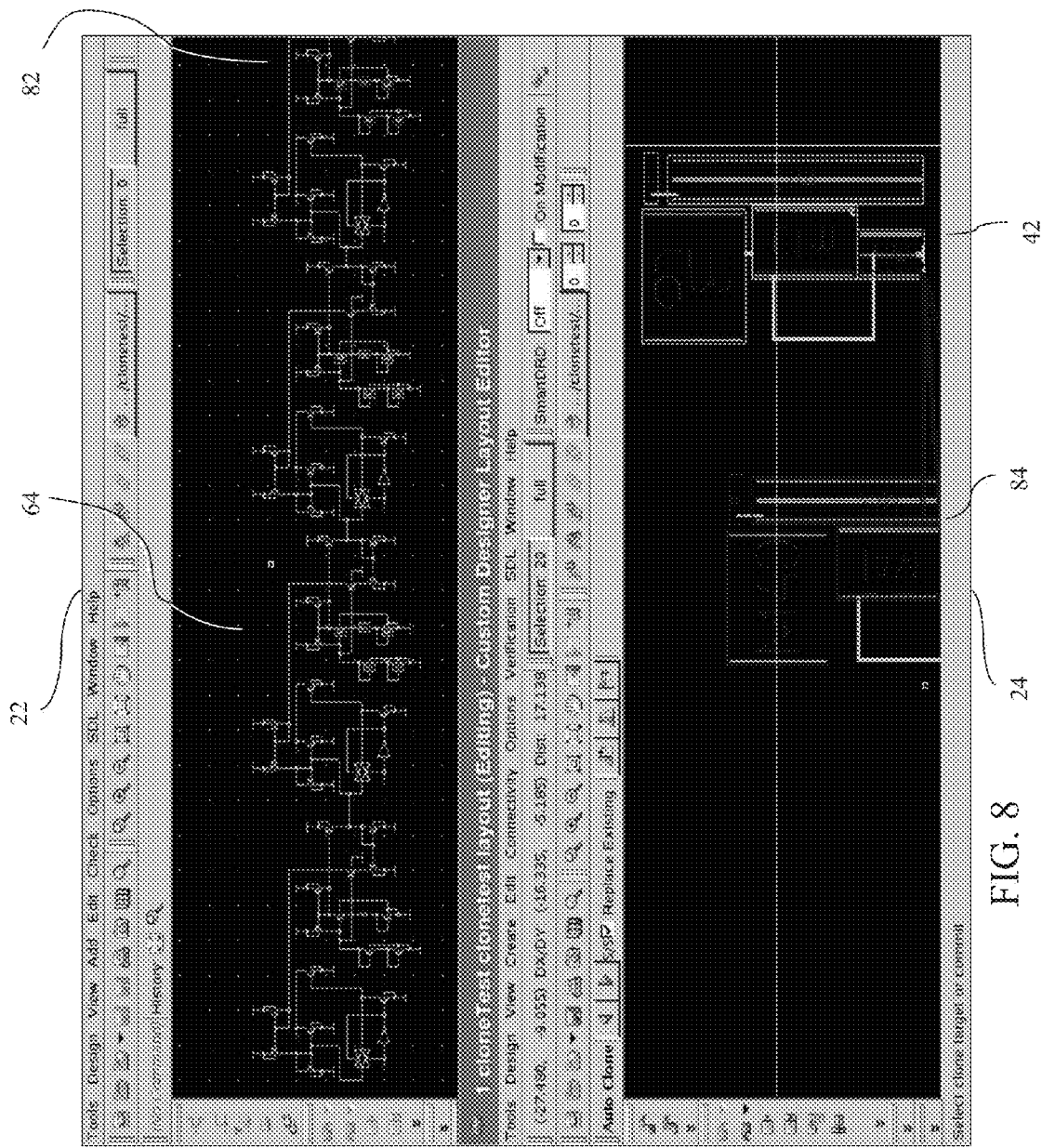

FIG. 8: User Selects a Different Clone Target by a Single Key Stroke

FIG. 8 illustrates an example of the user interface as it would appear, following that of FIG. 7, in which the user moves on to a different group 82 of target elements in the upper portion 22. As shown, the group 64 of five circuit elements that were previously highlighted are no longer highlighted distinctly. Now, another group 82 of five circuit elements, farther to the right, are highlighted differently from the other targets, which are not selected. This indicates that this different group 82 of circuit elements are now selected as the target elements.

The user may choose another group 82 of circuit elements by a simple command, such as a suitable mouse click, or click on the arrow switches of the clone command toolbar, or by a suitable keyboard keystroke.

The embodiment has also automatically generated another clone 84 of the clone source 42. The new clone 84 is also shown in the lower portion 24. Similarly to the clone 72 shown in FIG. 7, the new clone 84 of FIG. 8 also has uniquely identifying legends, including M40, M41, etc. As before, the clone 84 is distinguished from the clone source 42 by means of upper-case legend letters, while other embodiments might utilize other visually distinguishing characteristics.

Figure 9:
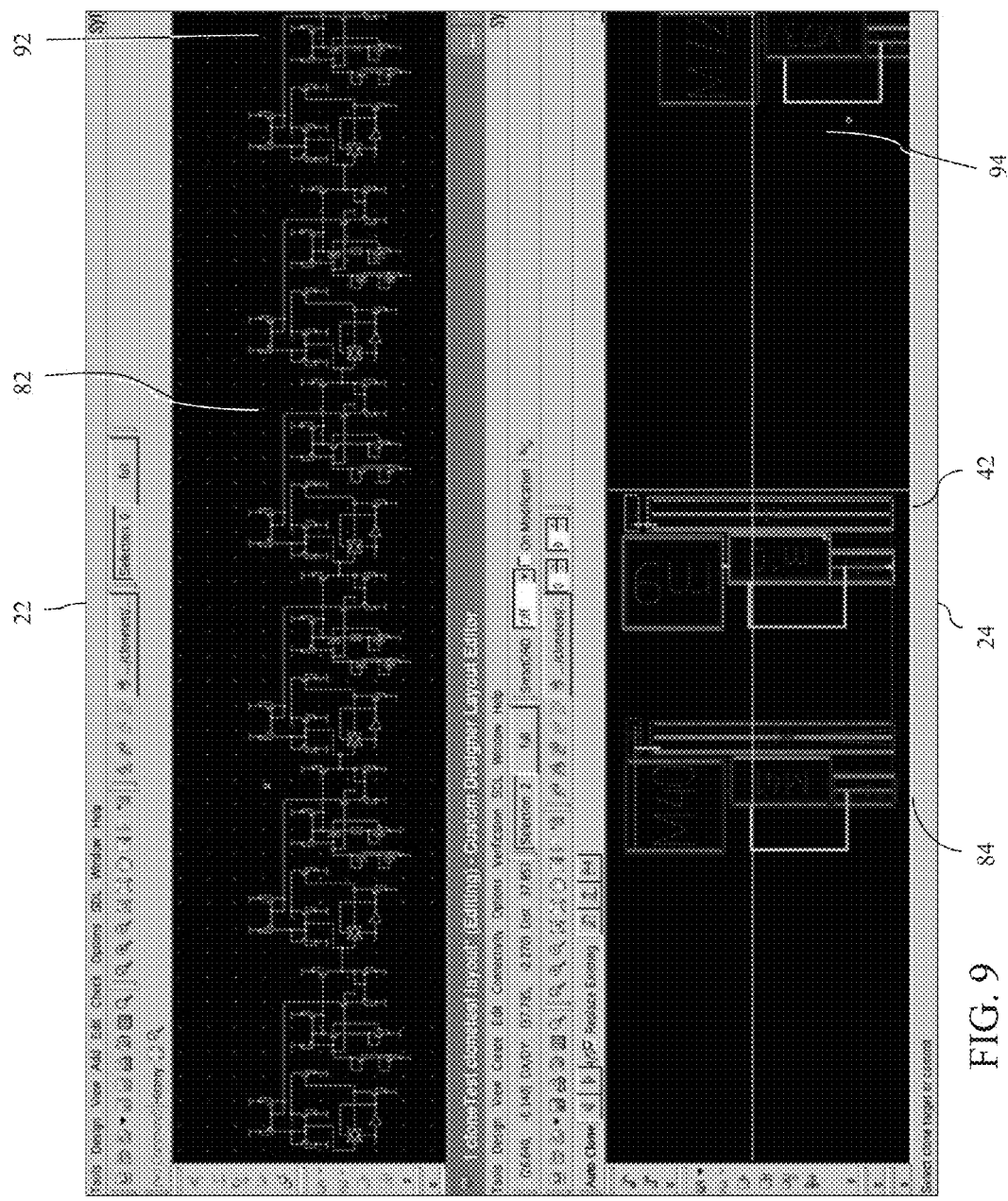

FIG. 9: User Commits a Clone Target to the Layout Design, the Next Clone Target Automatically Appear and all Highlighting/Toolbar are Automatically Refreshed FIG. 9 illustrates an example of the user interface as it would appear, following that of FIG. 8, if the user actually applies the clone 84 shown in the lower portion 24 to the five selected target elements 82 of the upper portion 22. Note, also, that the system has moved on, to select another group 92 of target candidates, to which additional clones can be applied next. Also, a new clone 94 has automatically been generated and shown in the lower portion 24, so the user is ready to go ahead and apply the new clone 94 to the next-selected target candidates 92.

In the upper portion 22, the images of the five selected target elements 82 have been changed from the previous appearance (small rectangles similar in size to the underlying schematic elements) to normal schematic elements (that is, to standard schematic symbols). In other embodiments, other changes of appearance can denote the actual application of a clone to a target. As the user continues to build the design layout by applying clones of various source elements to the appropriate target elements, the schematic diagram of the upper portion 22 will gradually look more and more like a finished design layout. However, the user will still have good visual clues as to which elements have not yet been done.

The rows of user command switches shown fir the lower portion 24 of FIG. 9 will be understood based on the discussion above. Note, particularly, that to the right of the Auto Clone legend and arrows, the legend ⅘ is shown. This legend has been ⅗ up until FIG. 9. It now has changed to indicate that one of the five targets has had a clone applied to it. Thus, the user has visual feedback as to progress toward completing the design layout, both from the visual appearance of the schematic diagram 22 and from the quantitative parameters shown in the rows of control switches. Thus, the user can be sure when no more targets remain.

Referring once again to the system block diagram of FIG. 1, it will be understood that embodiments might also be embodied in a computer program product, such as a prerecorded CD-ROM, for use with a general-purpose computer system in a manner that would be known to a person of ordinary skill in the art. Such a computer program product bears software for execution by the general purpose computer system. By executing the software, the general purpose computer system implements a design layout method in accordance with yet another embodiment of the invention.

Although the disclosed embodiments have been described in detail with reference to particular embodiments, persons possessing ordinary skill in the art will appreciate that various modifications and enhancements may be made without departing from the spirit and scope of the claims that follow.

What is claimed is:

1. A computer system for making a design layout based on a schematic diagram, the computer system comprising one or more processors and a memory coupled to the processors comprising instructions executable by the processors, the processors being operable when executing the instructions to provide a user interface which includes:
   a display of a schematic diagram of a layout to be designed, the schematic diagram including multiple occurrences of a target element;
   a display of a source element which corresponds with the target element;
   a user-operable input mechanism for selecting one of the multiple occurrences of the target element in the schematic diagram; and
   a user-operable input mechanism for directing the computer system to apply the source element to the selected target element,
   wherein:
      the user-operable input mechanism for directing the computer system to apply the source element to the selected target element includes (i) a user-operable input mechanism for directing the computer system to generate a clone of the source element, and (ii) a user-operable input mechanism for directing the computer system to apply the clone to the selected target element;
      the multiple occurrences of the target element are characterized by variability of a predetermined characteristic; and
      the user-operable input mechanism for directing the computer system to apply the clone to the selected target element further includes (i) a user-operable input mechanism for directing the computer system to vary the clone correspondingly with the variability of the selected target element, and (ii) a user-operable input mechanism for directing the computer system to apply the varied clone to the selected target element.

2. A computer system as recited in claim 1, wherein the user-operable input mechanism for selecting one of the multiple occurrences of the target element in the schematic diagram includes:
   a user-operable input mechanism for selecting a first one of the multiple occurrences of the target element within the schematic diagram; and
   a user-operable input mechanism for directing the computer system to change the selecting from the first one of the multiple occurrences of the target element to a second one of the multiple occurrences of the target element.

3. A computer system as recited in claim 1, wherein:
   the user-operable input mechanism for selecting one of the multiple occurrences of the target element in the schematic diagram includes processing and user interface apparatus which is operable for deriving source-to-target object mappings during a target search, and
   the user-operable input mechanism for directing the computer system to apply the source element to the selected target element includes processing and user interface apparatus which is operable for using the mappings to update connectivity of the layout of the clone to be the same as the selected target element, automatically and in real time as the selected target element is chosen;
   whereby the processing and user interface apparatus which is operable for deriving source-to target object mappings during a target search and the processing and user interface apparatus which is operable for using the mappings to update connectivity of the layout of the clone provide automatic connectivity update.

4. A computer system as recited in claim 1, further comprising processing and user interface apparatus which is operable, responsive to a change in the source layout, for displaying target candidates in the schematic diagram by (i) performing an automatic search for clone target candidates in the schematic diagram, and (ii) showing the clone target candidates distinctively.

5. A computer system as recited in claim 1, wherein:
   the design layout includes an electronic circuit design layout;
   the schematic diagram includes an electronic component which occurs multiple times within the electronic circuit design layout; and
   the source element includes a layout of a semiconductor fabrication of the electronic component.

6. A computer system as recited in claim 1, further comprising:
   a user-operable input mechanism for directing the computer system to select a portion of the design layout, wherein the user-operable input mechanism is operative responsive to user signaling from a selection mechanism; and
   wherein
   the user-operable input mechanism for directing the computer system to apply the source element to the selected target element within the schematic diagram is operative responsive to user keyboard key strokes.

7. One or more computer-readable non-transitory storage media embodying software comprising instructions operable when executed to:
   select a particular target element from one of multiple occurrences of the target element in a schematic diagram of a layout to be designed, the schematic diagram being displayed in a user interface; and
   apply a source element to the selected occurrence of the target element in the schematic diagram, wherein the source element corresponds with the target element and is displayed in the user interface;
   wherein:
      the program software code for directing the computer system to apply the source element to the selected target element includes (i) program software code for directing the computer system to generate a clone of the source element, and (ii) program software code for directing the computer system to apply the clone to the selected target element;
the multiple occurrences of the target element are characterized by variability of a predetermined characteristic; and
the program software code for directing the computer system to apply the clone to the selected target element further includes (i) program software code for directing the computer system to vary the clone correspondingly with the variability of the selected target element, and (ii) program software code for directing the computer system to apply the varied clone to the selected target element.

8. A computer program product as recited in claim 7, wherein the program software code for selecting the particular target element includes:
program software code for directing the computer system to select a first one of the multiple occurrences of the target element within the schematic diagram; and
program software code for directing the computer system to change the selecting from the first one of the multiple occurrences of the target element to a second one of the multiple occurrences of the target element.

9. A computer program product as recited in claim 7, wherein:
the program software code for directing the computer system to select the particular target element in the schematic diagram includes program software code for directing the computer system to derive source-to-target object mappings during a target search, and
the program software code for directing the computer system to apply the source element to the selected target element includes program software code for directing the computer system to use the mappings to update connectivity of the layout of the clone to be the same as the selected target element, automatically and in real time as the selected target element is chosen;
whereby the program software code for directing the computer system to derive source-to-target object mappings during a target search and the program software code for directing the computer system to use the mappings to update connectivity of the layout of the clone provide automatic connectivity update.

10. A computer program product as recited in claim 7, further comprising program software code for directing the computer system, responsive to a change in the source layout, to display target candidates in the schematic diagram by (i) performing an automatic search for clone target candidates in the schematic diagram, and (ii) showing the clone target candidates distinctively.

11. A computer program product as recited in claim 7, wherein:
the layout includes an electronic circuit design layout;
the schematic diagram includes an electronic component which occurs multiple times within the electronic circuit design layout; and
the source element includes a layout of a semiconductor fabrication of the electronic component.

12. A computer program product as recited in claim 7, further comprising:
program software code for directing the computer system to select a portion of the layout, wherein the program software code is operative responsive to user signaling from a selection mechanism; and wherein
the program software code for directing the computer system to apply the source element to the selected target element within the schematic diagram is operative responsive to user keyboard key strokes.

13. A method comprising:
by a computing system, displaying in a display of a user interface a schematic diagram of a layout to be designed, the schematic diagram including multiple occurrences of a target element, wherein the multiple occurrences of the target element are characterized by variability of a predetermined characteristic;
by the computing system, displaying in the display of the user interface a source element comprising a source layout which corresponds with the target element;
by the computing system, receiving a selection of one of the multiple occurrences of the target element in the schematic diagram; and
by the computing system, applying the source element to the selected target element wherein:
applying the source element to the selected target element includes (i) generating a clone of the source element, and (ii) applying the clone to the selected target element;
applying the clone to the selected target element comprises varying the clone correspondingly with the variability of the selected target element and applying the varied clone to the selected target element.

14. A method as recited in claim 13, further comprising, responsive to a change in the source layout, displaying target candidates in the schematic diagram by (i) performing an automatic search for clone target candidates in the schematic diagram, and (ii) showing the clone target candidates distinctively.

15. A method as recited in claim 13, further comprising, by the computing system:
responsive to user signaling from a selection mechanism, selecting a portion of the design layout; and wherein
applying the source element to the selected target element within the schematic diagram is operative responsive to user key strokes.

* * * * *